United States Patent [19]

Jackson, Jr.

[11] 4,439,267
[45] Mar. 27, 1984

[54] VAPOR-PHASE METHOD FOR GROWING MERCURY CADMIUM TELLURIDE

[75] Inventor: David A. Jackson, Jr., Springfield, Va.

[73] Assignee: The United States of America as represented by the Secretary of the Army, Washington, D.C.

[21] Appl. No.: 426,428

[22] Filed: Sep. 29, 1982

[51] Int. Cl.³ .............................................. C30B 25/12
[52] U.S. Cl. .................................... 156/614; 118/728; 156/DIG. 72; 156/DIG. 98
[58] Field of Search ............... 156/612, 613, DIG. 72, 156/DIG. 82, 610, 611, 614, DIG. 98; 427/160, 76, 45.1; 148/175; 118/728; 248/311.2; 252/62.3 S, 62.3 V; 422/245

[56] References Cited

U.S. PATENT DOCUMENTS

| | | | |
|---|---|---|---|
| 3,312,571 | 4/1967 | Ruehrwein | 148/175 |
| 3,619,283 | 11/1971 | Carpenter | 156/614 |
| 3,642,529 | 2/1972 | Lee et al. | 156/614 |
| 4,066,481 | 1/1978 | Manasevit | 156/613 |
| 4,141,778 | 2/1979 | Domracher et al. | 156/DIG. 72 |

Primary Examiner—Hiram H. Bernstein
Attorney, Agent, or Firm—Milton W. Lee; Anthony T. Lane; Aubrey J. Dunn

[57] ABSTRACT

The growth of mercury cadmium telluride ($Hg_{(1-x)}Cd_x Te$) alloys is carried out by the pyrolytic decomposition of a mixture of Cd and Te alkyls in an atmosphere of Hg vapor; the ternary alloy is deposited as an epitaxial film on a CdTe single crystal substrate. The substrate is carried on a heated susceptor in a reactor vessel. The susceptor also has a cavity in which mercury is heated (at a temperature different from the substrate temperature) to provide Hg vapor. A mixture of dimethyl cadmium and diethyl tellurium gases flows through the reactor, the gases thermally decompose in the vicinity of the substrate, and combine with the Hg vapor to form $Hg_{(1-x)}Cd_x Te$ on the substrate. The relative proportions of dimethyl cadmium and diethyl tellurium determine x in the compound.

3 Claims, 2 Drawing Figures

VAPOR-PHASE METHOD FOR GROWING MERCURY CADMIUM TELLURIDE

The invention described herein may be manufactured, used, and licensed by the U.S. Government for government purposes without payment of any royalties thereon.

BACKGROUND OF THE INVENTION

This invention is in the field of mercury cadmium telluride (HgCdTe) crystal growth. HgCdTe crystals currently are finding use in imaging detectors for infrared radiation. Various methods are known whereby these crystals may be produced and include: solid state recrystalliation, liquid phase epitaxy, elemental vapor phase transport, encapsulated close-spaced diffusion, and organo-metallic vapor phase epitaxy (OMVPE). In all cases sufficient mercury vapor must be maintained so as to prevent the dissociation of the ternary alloy. The existing OMVPE method is essentially one where within an open-flow glass reactor, a stream of mixed alkyls (such as dimethyl cadmium and diethyl tellurium) is pyrolytically dissociated in an atmosphere of elemental mercury vapor; and subsequently the CdHgTe alloy is deposited on a heated single crystal substrate of CdTe. The mercury vapor atmosphere is generated by heating elemental mercury in a reservoir with a hot plate, heating mantle or custom built oven. The substrate is placed on a susceptor pedestal made of carbon for example, and heated by R.F. induction. The system therefore has requirements for two separate heat sources... one to generate mercury vapor from a reservoir and a second to heat the susceptor/substrate by R.F. means. Each source must be separately controlled for two different required temperatures. A single heat source for both purposes would be desirable. Mercury vapor tends to condense quickly near the closest cool area, unless a hot walled reactor is used. On the other hand, metal alkyls will prematurely decompose in a hot walled reactor; thus the requirements for R.F. heating, where only the substrate/susceptor gets hot. The two heated conditions obviously work against each other for the required task. The present invention is a new OMVPE method which addresses the problems of multiple heat sources, hot walled reactor requirements and premature alkyl cracking.

SUMMARY OF THE INVENTION

The invention is a new simplified OMVPE method for growing HgCdTe crystals. The method includes the steps of placing a CdTe substrate and a mercury sample on a susceptor in a reactor and differentially heating the susceptor to bring the substrate and mercury to different temperatures. By using a single R.F. working coil and a uniquely designed dual purpose susceptor, multiple heat zones may be generated in a common susceptor such that there exists a simultaneous evolution of a reactant (mercury) at one temperature as well as the thermal decomposition of other reactants (metal alkyls) and deposition of the products (HgCdTe) at another temperature. The susceptor is dual purpose in that it serves as a reservoir for the mercury as well as a holder for the CdTe substrate. Since the reservoir is in close proximity of the substrate, there is no need for a hot-walled reactor. In fact, a water cooled jacket may be used to off-set any heating by radiation.

DESCRIPTION OF PREFERRED EMBODIMENT

Figure 1:
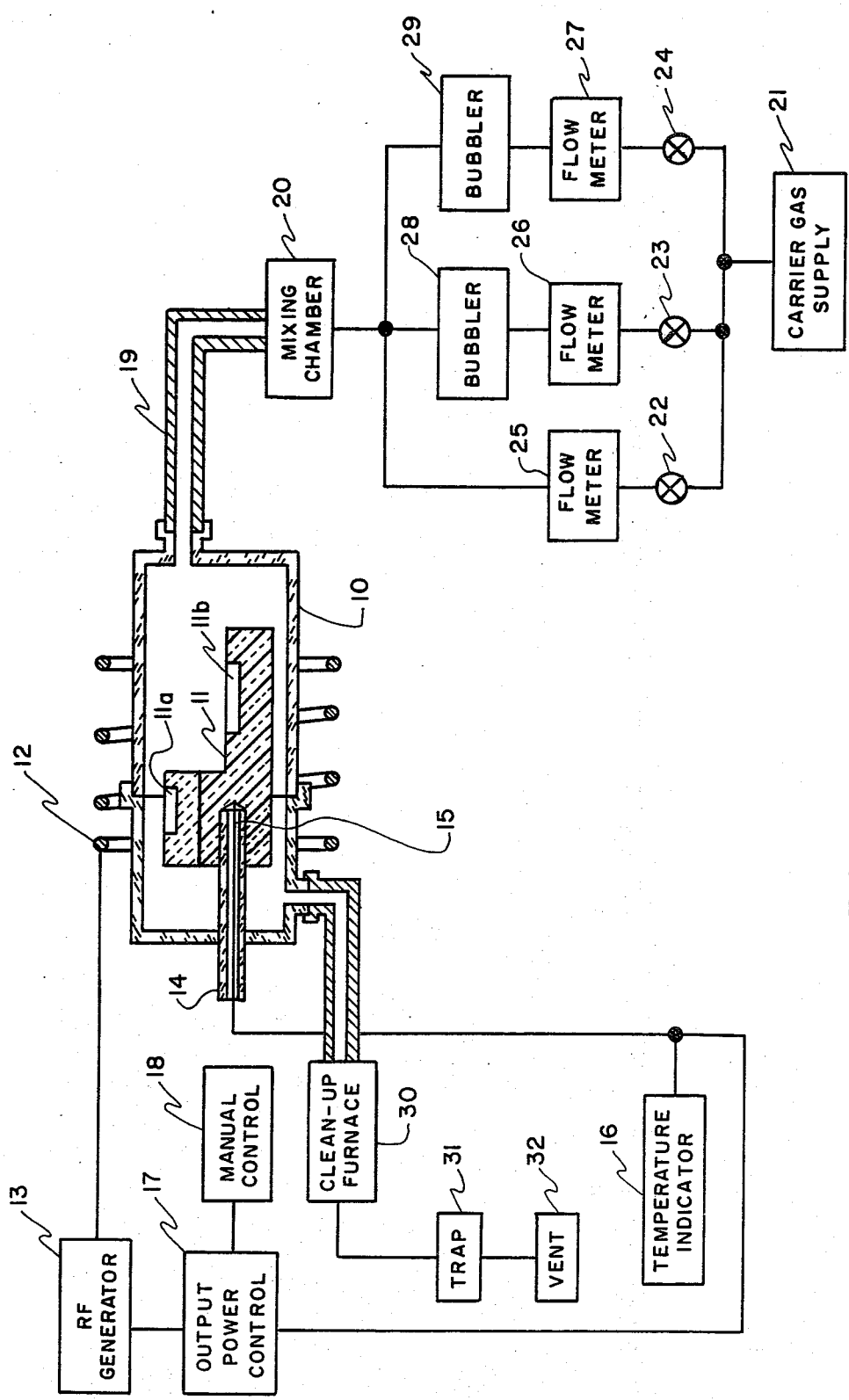
FIG. 1 is a schematic showing of an apparatus with which the inventive method may be practiced.

The invention may be best understood when this description is taken in conjunction with the drawings. FIG. 1 schematically shows a system with which the instant methods may be practiced and includes reactor 10 in which the crystals are grown, with susceptor 11 therein. The reactor is surrounded in part by coil 12 fed by radio-frequency generator 13. The walls of reactor 10 are made of a material (such as glass or quartz) transparent to the output energy of 13, and susceptor 11 is made of a material such as carbon (graphite) which will absorb the output energy of 13 and which is non-reactive with the materials to be placed on or in it. Cavities 11a and 11b are formed in 11 for holding respectively a single crystal growth substrate (such as cadmium telluride, indium antimonide, or germanium) and liquid mercury (neither shown). When generator 13 is on, and the substrate and mercury are in place, the susceptor will absorb energy and the substrate will be heated to a temperature different from that of the mercury, because of the construction of the susceptor and the coil placement. Typical susceptor configurations are shown in my copending U.S. patent application being Ser. No. 429,656 filed Sept. 30, 1982 and having attorney docket number NVL 2660. Susceptor 11 is with glass or quartz tube 14 containing thermocouple wire 15 inside 14 to provide a temperature indication of 11. The thermocouple output feeds temperature indicator 16 and output power control 17 for generator 13. The initial set-up of the system is as follows: with 11,14, and 15 outside of 10, the substrate and mercury are loaded into the respective places 11a and 11b in susceptor 11; 11 is then placed onto 14 and 15 and this assemblage is inserted into reactor 10. Generator 13 is energized by manual control 18 and the system operator observes temperature indicator 16 and adjusts 18 until the desired temperature of the susceptor is obtained. The way by which two different temperatures are obtained on the susceptor is shown in the patent application referred to above. Once the desired temperature is obtained, it may be maintained by control 17 automatically controlling the output energy of 13. The particular means for accomplishing this automatic temperature control are not critical and are well known in the art. While 11 is being brought up to temperature, reactor 10 is being purged by gas or gases from conduit 19. This conduit is connected to mixing chamber 20 and the chamber may be fed carrier gas from carrier gas supply 21 through any one path (or more than one) including valves 22, 23, or 24, flow meters 25,26,27, and bubblers 28 and 29. Valve 22 and meter 24 are used when it is desired to purge 10. Bubblers 28 and 29 contain liquid alkyls such as diethyl telluride and dimethyl cadmium respectively and are cooled to 0° C. with an ice bath. The carrier gas may be hydrogen, helium, or nitrogen, or may be switchable amongst these gases.

As the temperature of 11 approaches the desired value, valve 22 is closed and valves 23 and 24 are opened to the desired flow rates through meters 26 and 27. The outputs of 28 and 29 combine in mixing chamber 20 and pass through conduit 19 to reactor 10. In the reactor, alkyl gases thermally decompose in the vicinity of the substrate on 11a of the susceptor, and the tellurium and cadmium products combine on the substrate to form as mercury cadmium telluride $Hg_{(1-x)}Cd_xTe$ alloy. Excessive alkyl gases pass into clean-up furnace 30 and are decomposed therein. Any solid particles from 30 are caught by trap 31 and the gaseous outputs from 30 are dumped to the atmosphere by vent 32. When the proper HgCdTe film thickness of the alloy is reached, as empirically determined from time and gas flow rates, the gaseous alkyl gases are turned off; the systems are purged, the susceptor is held at a predetermined annealing temperature for a time, then is allowed to cool down to ambient temperature. All gas flow is stopped, the susceptor is removed, and the substrate is removed from the susceptor.

For the growth to occur, the mercury atmosphere (i.e. the partial pressure of mercury) must achieve at least a minimum value of 0.01 atmosphere in order to prevent the thermal decomposition of the deposited film. This equilibrium pressure may be obtained by heating the mercury source to 180° C. during the alloy deposition. In actual practice, the temperature of the mercury source may be maintained at 200° C. or higher. Any excess mercury vapor which does not react with the alkyls will not stick to the hot substrate, but will condense elsewhere in the reactor at a cooler area. This excess has not detrimental effect on the growth of the alloy.

The deposition rate of the alloy is primarily determined by the combined flow rates of the carrier gas through the alkyls. The composition of the alloy is primarily determined by the ratio of the flow rates of the carrier gas through the alkyls.

Figure 2:
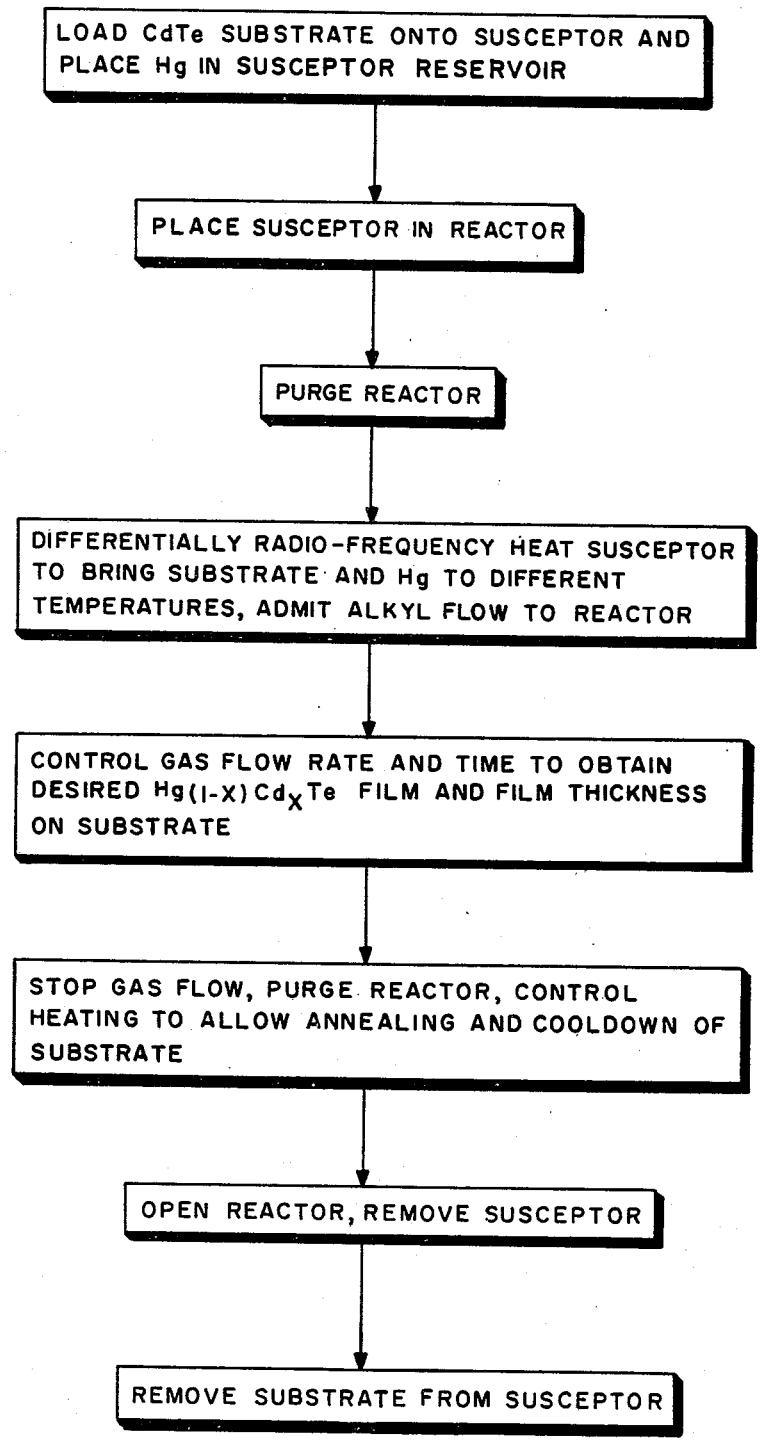
FIG. 2 is a flow chart of the method.

FIG. 2 shows a flow chart all the steps described above. Some of the particulars of the method are as follows: temperature of substrate (during crystal growth), approximately 410° C.; ratio of carrier gas flow rates, 23.1:1 for diethyl tellurium: dimethyl cadmium (this ratio is determined by the partial pressure of the alkyls at 0° C.); annealing temperature, 400° C. for 5 minutes.

Close control of the composition of the alloy is necessary since a slight change in the value of the x in $Hg_{(1-x)}Cd_xTe$ will drastically change the detection capabilities of the materials. For instance, when $x=0.25$, the detectors are useful in the 3–5 microm spectral region. Yet, when $x=0.21$ the detectors are useful in the 8–12 microm region.

It is expected that the use of this method of growing semiconductor alloys is not restricted to the II-VI compounds, such as CdTe and CdHgTe. There is no reason not to expect that this method could be used for the fabrication of III-V compounds such as $Ga_{(1-x)}Al_xAs$ or $Ga_{(1-x)}In_xSb$.

I claim:

1. A method of growing mercury cadmium telluride of the chemical notation $Hg_{(1-x)}Cd_xTe$, in a cold wall reactor, wherein x is greater than zero and less than 1, on a semiconductor substrate, including the steps of:

loading said substrate onto a susceptor;
loading mercury in a reservoir in said susceptor;
placing said suceptor and its load into a reactor;
purging said reactor;
differentially radio-frequency heating said susceptor to bring said substrate and said mercury to different predetermined temperatures whereby mercury vapor pervades said reactor and, as said temperatures are reached;
admitting alkyl gases to said reactor;
controlling the time and the flow rates of said gases, whereby said gases are thermally decomposed in the vicinity of said substrate and at least some of the decomposition products of the gases combine with the mercury vapor to form mercury cadmium telluride on said substrate;
stopping the flow of gases, purging the reactor, and controlling the temperature of susceptor to allow annealing of the substrate and cooldown;
removing the susceptor and its load from the reactor, and;
removing the substrate from the susceptor.

2. The method of claim 1 wherein said substrate is chosen from the group comprising: cadmium telluride, indium antimonide, and germanium.

3. The method of claim 1 wherein said alkyl gases are diethyl telluride and dimethyl cadmium.

* * * * *